(12) United States Patent
Hirano

(10) Patent No.: US 6,404,681 B1
(45) Date of Patent: Jun. 11, 2002

(54) METHOD FOR ERASING DATA FROM A NON-VOLATILE SEMICONDUCTOR MEMORY DEVICE

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/703,516

(22) Filed: Oct. 31, 2000

(30) Foreign Application Priority Data

Feb. 2, 2000 (JP) ........................................ 2000-025779

(51) Int. Cl.$^7$ .............................................. G11C 16/04
(52) U.S. Cl. ............................. 365/185.33; 365/185.11; 365/185.18; 365/185.26; 365/185.28
(58) Field of Search ...................... 365/185.33, 185.28, 365/185.18, 185.11, 185.26, 185.01

(56) References Cited

U.S. PATENT DOCUMENTS

| | | | | |
|---|---|---|---|---|
| 5,619,450 A | * | 4/1997 | Takeguchi | 327/434 |
| 5,894,438 A | * | 4/1999 | Yang et al. | 365/185.18 |
| 5,898,606 A | * | 4/1999 | Kobayashi et al. | 365/185.11 |
| 6,043,123 A | * | 3/2000 | Wong et al. | 438/258 |
| 6,160,739 A | * | 12/2000 | Wong | 365/185.29 |
| 6,166,962 A | * | 12/2000 | Chen et al. | 365/185.24 |
| 6,212,103 B1 | * | 4/2001 | Ahrens et al. | 365/185.29 |

FOREIGN PATENT DOCUMENTS

JP  6-96592  4/1994

OTHER PUBLICATIONS

Bude, J. D. et al. (1997). "Secondary Electron Flash—a High Performance, Low Power Flash Technology for 0.35 $\mu$m and Below," *Proceedings of the 1997 International Electron Devices Meeting* 279–282.

* cited by examiner

*Primary Examiner*—Hoai V. Ho
(74) *Attorney, Agent, or Firm*—Morrison & Foerster LLP

(57) ABSTRACT

A method is provided for erasing data from a non-volatile semiconductor memory device including a matrix of memory cells grouped into one or more blocks in which data can be electrically written to or erased from the memory cells being formed by a field effect transistor including a drain, a source, a floating gate and a control gate, each block including a first well of a first conductivity type provided on a substrate of a second conductivity type, a second well or second conductivity type provided on the first well electrically isolated from the substrate by the first well, and a plurality of memory cells provided on the second well, the sources of the memory cells in each block commonly connected to one another. The method includes steps of: withdrawing electrons from each floating gate through a Fowler-Nordheim tunnel phenomenon to perform a batch erase operation, on all memory cells in each block; and prior to the batch erase operation, performing a pro-erase write operation in which a first voltage, a second voltage of an opposite polarity to the first voltage and a third voltage of the same polarity an the first voltage are respectively applied to the control gates, the second wells and the first wells of all of the memory cells in the block to be erased so that electrons are injected into the floating gates of each memory cell through a Fowler-Nordheim tunnel phenomenon.

5 Claims, 10 Drawing Sheets

METHOD FOR ERASING DATA FROM A NON-VOLATILE SEMICONDUCTOR MEMORY DEVICE

BACKGROUND OF THE INVENTION

1. Field of the Invention

The present invention relates to a method for erasing data from a non-volatile semiconductor memory device. More particularly, the present invention relates to a method for erasing data from a non-volatile semiconductor memory device which employs a write method using channel hot electrons. 2. Description of the Related Art An ETOX (registered trademark of Intel; EPROM Thin Oxide) type non-volatile semiconductor memory device is the most widely used conventional non-volatile semiconductor memory device (a flash memory). Japanese Patent Publication for Opposition No. 6-82841 (Conventional Example 1) discloses a non-volatile semiconductor memory device of this type. Referring to FIG. 1, the structure of a cell of an ETOX type non-volatile semiconductor memory device will be described. The non-volatile semiconductor memory device cell includes a source 14$a$ and a drain 14$b$ which are formed on a substrate 10, with a channel layer 14$c$ extending therebetween. A floating gate 16 is provided over the channel layer 14$a$ via a tunnel oxide film 15. Moreover, a control gate 18 is provided over the floating gate 16 via an interlayer insulating film 17.

The principle of operation of an ETOX type non-volatile semiconductor memory device will now be described. Table 1 shows voltages to be respectively applied to the control gate 18, the drain 14$b$, the source 14$a$ and the substrate 10 in a write mode, an erase mode, and a read mode.

TABLE 1

|       | Control gate | Drain   | Source | Substrate |
|-------|--------------|---------|--------|-----------|
| Write | 10 V         | 6 V/0 V | 0 V    | 0 V       |
| Erase | −9 V         | Open    | 6 V    | 0 V       |
| Read  | 5 V          | 1 V     | 0 V    | 0 V       |

In the write (programming) mode, a voltage of 10 V, for example, is applied to the control gate 18 of the memory cell to which data is to be written, a reference voltage of 0 V, for example, is applied to the source 14$a$ thereof, and a voltage of 6 V, for example, is applied to the drain 14$b$. A large current of 500 $\mu$A/cell flows through the channel region 14$c$, thereby generating channel hot electrons (hereinafter, referred to as "CHEs") in a portion of the drain 14$b$ side of the memory cell where there is a high electric field. Basically, CHEs are high-energy electrons which are generated by a high electric field and which flow through the channel. When CHEs jump over the energy barrier of the tunnel oxide film so as to be injected into the floating gate 16, the threshold voltage of the memory cell increases. The drain of each memory cell (non-selected memory cell) to which no data is to be written is set to a reference voltage (e.g., 0 V). The memory cell to which data has been written as described above has a threshold voltage equal to or greater than 5.5 V as shown in FIG. 2 by the curve labelled "Programmed state (a)". As shown in FIG. 2, each memory cell whose threshold voltage is equal to or less than 3.5 V is in an erased state, and each memory cell whose threshold voltage is equal to or greater than 5.5 V is in a written (programmed) state.

In the erase mode, a voltage of −9 V, for example, is applied to the control gate 18 and a voltage of 6 V, for example, is applied to the source 14$a$, whereby electrons are withdrawn from the floating gate 16 on the source 14$a$ side of the memory cell, thereby reducing the threshold voltage. In such a case, the memory cell has a threshold voltage as shown in FIG. 2 by the curve labelled "Erased state (b)". Thus, the threshold voltage of the memory cell whose data has been erased is less than or equal to 3.5 V.

FIG. 3 illustrates how electrons are withdrawn from the source side. In the erase operation, a BTBT (band to band tunneling) current flows through the device, as shown in FIG. 3. Simultaneously with this current flow, hot holes and hot electrons are generated. While the hot electrons flow into the substrate, the hot holes are drawn toward the tunnel oxide film and trapped therein. It is believed in the art that this trapping degrades the reliability of the device.

For a memory cell to/from which data has been written/erased, a read operation can be performed by applying a voltage of 5 V to the control gate 18 and a voltage of 1 V to the drain 14$b$, while controlling the potential of the source 14$a$ to be 0 V. Under such voltage conditions, if data stored in the memory cell is in the erased state, the threshold voltage of the memory cell is less than or equal to 3.5 V. Therefore, a current flows through the memory cell, which is detected by a sense circuit (not shown) connected to the drain, whereby the data in the memory cell is determined to be "1" (i.e., in the erased state). If data stored in the memory cell is in the written state, the threshold voltage of the memory cell is equal to or greater than 5.5 V, and no current flows through the memory cell, whereby the data in the memory cell is determined by the sense circuit to be "0" (i.e., in the written state).

The write, erase and read operations are performed according to such a principle of operation. In an actual device, the erase operation is performed in a relatively larger unit of blocks, e.g., by 64-kB blocks. Within each block to be erased, the memory cells have varied threshold voltages because some of the memory cells have data in the programmed state and other memory cells have data in the erased state. Therefore, it is necessary to perform the erase operation by using a complicated algorithm as shown in FIG. 4 (Japanese Laid-Open Publication No. 9-320282).

The erase method shown in FIG. 4 will now be described. When the erase operation is initiated, all of the memory cells in one block are brought into a written state by an ordinary write operation (the write method using CHEs) (step S1).

Next, a program verify operation is performed by 8-bit blocks (step S2) for verifying that the threshold voltage of the memory cell to which data has been written in step S1 is equal to or greater than 5.5 V. If the threshold voltage of the memory cell is not equal to or greater than 5.5 V, the process returns to step S1 to continue the write operation. If the threshold voltage is equal to or greater than 5.5 V, the process proceeds to step S3.

In step S3, an erase pulse is applied to the memory cells by blocks. Data is erased from a memory cell by withdrawing electrons from the source side of the memory cell so as to reduce the threshold voltage thereof. Next, in step S4, an erase verify operation is performed for verifying that the threshold voltage of each of the memory cells in the block is less than or equal to 3.5 V. If the threshold voltage of the memory cell is not less than or equal to 3.5 V, the process returns to step S3 to continue the erase operation. If the threshold voltage of the memory cell is less than or equal to 3.5 V, the erase operation is completed.

As can be seen, in the erase method of FIG. 4, all of the memory cells in a block to be erased are first brought to a written state so that the threshold voltage distribution after the erase operation is as narrow as possible and that there are no over-erased cells (i.e., a cell whose threshold voltage is less than or equal to 0 V). This write operation can be performed for eight memory cells at once by an ordinary program operation. If the write time for one memory cell is 2 μs, the amount of time required for this write operation (or the pre-erase write time) is obtained as follows:

$$2 \mu s \times 64 \text{ kB}/8 = 131 \text{ ms}$$

If the total erase time is 600 ms, the pre-erase write time accounts for about 20% of the total erase time. The pre-erase write time of 131 ms holds in the case where a 5 V power source is used, and increases to 262 ms in the case where a 3 V power source is used. This is because when a 3 V power source is used, the capability of the charge pump for increasing the supply voltage to obtain the pre-erase write voltage, e.g., the voltage applied to the control gate, is poor, so that the pre-erase write operation can be performed for only 4 bits at a time, thereby resulting in the increase in the pre-erase write time. The problem of the long pre-erase write time is more pronounced as the level of the supply voltage is reduced.

The program verify operation in step S2 is performed by 8-bit blocks with a verification time per one cell of 100 ns. Thus, the amount of time required for the program verify operation is about 6.6 ms (=100 ns×64 kB/8).

Moreover, the current consumption is large because the verify operation is performed by 8-bit blocks. Furthermore, the application of the erase pulse in step S3, if performed by a conventional method, may cause a BTBT current as described above. As a result, a relatively large current flows through the device. The total time required for applying the erase pulse is about 300 ms, and the current consumption therefor is about 5.24 mA where the current consumption per one cell is 10 nA and each block includes 64 kB cells (10 nA×64 kB).

Since the write operation is performed by using CHEs, the peak value of the write current per one cell is 500 μA. Thus, a very large current is consumed.

In the erase method of FIG. 4, the total pulse application time may be reduced by increasing the voltage to be applied to the source in the erase pulse application operation. However, if the source voltage is increased, the BTBT current also increases, thereby increasing the holes which are trapped in the tunnel oxide film, and degrading the reliability of the device. Thus, it is not possible to further increase the source voltage and therefore, it is not possible to further increase the erase speed.

As described above, problems associated with conventional ETOX type flash memories include the following: (1) the erase speed is low; and (2) the current consumption is large. Problem (1) occurs since the programming of all of the bits in a block before the erase pulse application (i.e., the pre-erase write operation) takes a long time, whereby it is not possible to reduce the amount of time required for the erase pulse application. Problem (2) occurs as follows. The current consumption is large because the pre-erase write operation (the operation of writing all of the bits in a block before the erase pulse application) uses CHEs. The current consumption is further increased because the BTBT current flows through the device in the erase pulse application operation. In addition, a large current is also consumed in the verify operation which is performed after the pre-erase write operation.

One solution to the above-described problems is the method disclosed in Japanese Laid-Open Publication No. 6-96592 (Conventional Example 2). According to this method, the pre-erase write operation is performed on all of the memory cells at once through a Fowler-Nordheim (or "FN") tunnel phenomenon. The memory cells which can be used with this method are the same as those shown in FIG. 1. Table 2 shows voltages to be respectively applied to the control gate 18, the drain 14b, the source 14a and the substrate 10 in a write mode, an erase mode, a pre-erase write mode, and a read mode.

TABLE 2

|  | Control gate | Drain | Source | Substrate |
| --- | --- | --- | --- | --- |
| Write | 10 V | 6 V/0 V | 0 V | 0 V |
| Erase | −9 V | Open | 6 V | 0 V |
| Pre-erase write | 18 V | Open | 0 V | 0 V |
| Read | 5 V | 1 V | 0 V | 0 V |

As can be seen from Table 2, a high voltage (18 V) is applied to the control gate in the pre-erase write operation. Therefore, a high electric field is generated between the channel region of the memory cell and the floating gate, whereby electrons are injected from the channel region of the memory cell into the floating gate. In this method, the amount of current to be consumed per one cell is as small as 10 pA because the method utilizes the FN tunnel phenomenon in the pre-erase write operation. Therefore, it is possible to simultaneously write data to a plurality of memory cells in one block, and to reduce the amount of time required for the pre-erase write operation, even when considering the capability of the charge pump and the value of acceptable current of the lines used in the IC.

However, the method of Conventional Example 2 has the following problems. Since the voltage to be applied to the word line which is connected to the control gate is as high as 18 V, it is necessary to use highly voltage resistant transistors in the word line output stage. Therefore, the area to be occupied by the transistors increases, thereby increasing the layout area of the device. Such a voltage value of 18 V is higher than normal operation voltages which are used in practice. This in turn complicates the structure of booster charge pumps to be provided in the device for generating such a high voltage, increasing the area to be occupied by such booster charge pumps, and thus increasing the layout area of the device. Moreover, the use of a high voltage may increase the stress on transistors in peripheral circuits, thereby degrading the reliability of the device.

SUMMARY OF THE INVENTION

According to one aspect of this invention, there is provided a method for erasing data from a non-volatile semiconductor memory device including a plurality of memory cells arranged in a matrix in which data can be electrically written to or erased from each of the memory cells, each of the memory cells being formed by a field effect transistor including a drain, a source, a floating gate and a control gate, the plurality of memory cells being grouped into one or more blocks, each of the blocks including a first well of a first conductivity type which is provided on a substrate of a second conductivity type, a second well of the second conductivity type which is provided on the first well so as to be electrically isolated from the substrate by the first well, and a plurality of memory cells having a plurality of sources which are provided on the second well, the sources of the memory cells in each block being commonly connected to one another. The method includes the steps of: withdrawing electrons from each floating gate of each of the memory cells through a Fowler-Nordheim tunnel phenomenon so as to perform a batch erase operation of erasing data from all of the memory cells in each block; and prior to the batch erase operation, performing a pre-erase write operation in which a first voltage, a second voltage of an opposite polarity to the first voltage and a third voltage of the same polarity as the first voltage are respectively applied to the control gates, the second wells and the first wells of all of the memory cells in the block to be erased so that electrons are injected into the floating gates of each of the memory cells through a Fowler-Nordheim tunnel phenomenon.

In one embodiment of the invention, first voltage and the third voltage are positive voltages, the second voltage is a negative voltage, and the first voltage is higher than the third voltage.

In one embodiment of the invention, in the batch erase operation, a negative voltage is applied to each control gate of each of the memory cells and a positive voltage is applied to each source of the memory cells so as to withdraw electrons from a source side of the memory cells, thereby reducing a threshold voltage of the memory cells.

In one embodiment of the invention, in the batch erase operation, a negative voltage is applied to each control gate of each of the memory cells, and a positive voltage is applied to each source of each of the memory cells and the second well so as to withdraw electrons from a channel region between respective sources and drains, thereby reducing a threshold voltage of the memory cells.

In one embodiment of the invention, in the pre-erase write operation, a positive voltage is applied to each control gate of each of the memory cells, and a negative voltage is applied to each source of each of the memory cells and the second well so that electrons are injected from a channel region between respective sources and drains into the floating gate, thereby increasing a threshold voltage of the memory cells.

Thus, the invention described herein makes possible the advantages of providing a method for erasing data from a non-volatile semiconductor memory device in which it is possible to reduce a voltage to be applied to a control gate in a pre-erase write operation.

These and other advantages of the present invention will become apparent to those skilled in the art upon reading and understanding the following detailed description with reference to the accompanying figures.

DESCRIPTION OF THE PREFERRED EMBODIMENTS

The preferred embodiments of the method for erasing data from a non-volatile semiconductor memory device according to the present invention will now be described with reference to the accompanying drawings.

Figure 5:
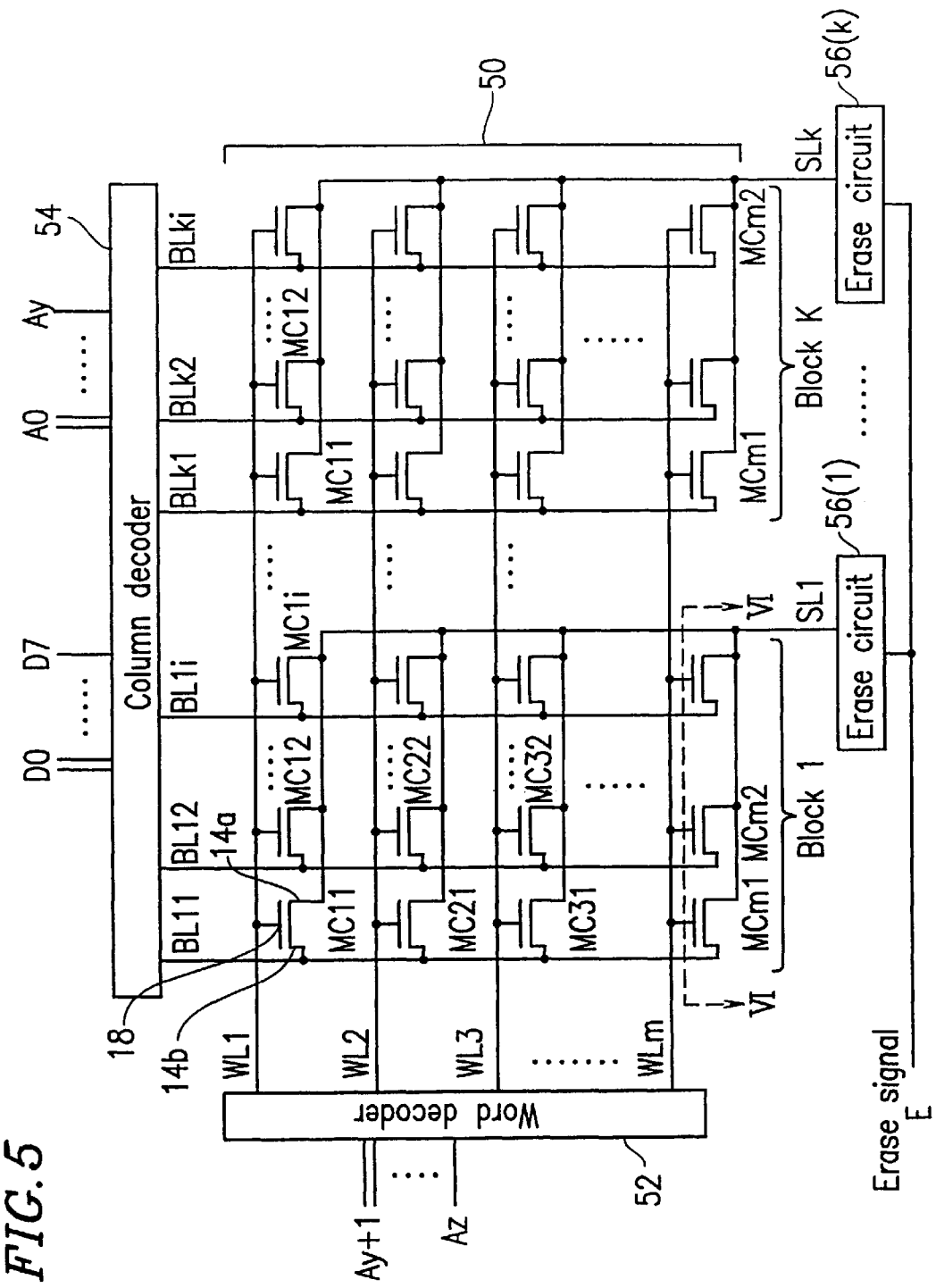
FIG. 5 illustrates the two-dimensional structure of a memory array section of a non-volatile semiconductor memory device used in the present invention.

First, a non-volatile semiconductor memory device used in the present invention will be described. FIG. 5 illustrates the two-dimensional structure of a portion of a memory array section thereof.

The memory array section includes a memory cell array 50 including a plurality of memory cells MC, which are arranged in a matrix, in which data can be electrically written to or erased from the memory cells MC. Each one of the memory cells MC is formed by a field effect transistor including a source 14a, a drain 14b, a floating gate 16 (not shown in FIG. 5), and a control gate 18.

The memory array section shown in FIG. 5 further includes a word decoder 52 for providing a voltage signal to the control gate 18 of each memory cell MC via a word line WL, and a column decoder 54 for providing a voltage signal to the drain 14b of each memory cell MC via a bit line BL. In the illustrated example, the memory array section includes m (for example, m=2048) word lines WL1, WL2, . . . , WLm, to each of which the control gates 18 of n (for example, n=512) memory cells MC are connected.

The memory cells MC are grouped into one or more blocks, i.e., block 1, . . . , block k (k=1, 2, 3, . . . ), each block including ixm memory cells MC which are connected to the word lines WL1, . . . , WLm. For the memory cells MC of block 1, the drains 14b of memory cells MCx1 (where x=1 to m) are connected to the bit line BL11, and the drains 14b of the memory cells MCx2 are connected to the bit line BL12. Similarly, the drains 14b of the memory cells MCxi are connected to the bit line BL1i. The memory cells MC of the other blocks are also connected to the respective word lines WL and bit lines BL in the same manner as the block 1. In the example shown in FIG. 5, the grouping of the memory cells MC into blocks is based on the bit lines BL. Alternatively, the grouping may be based on the word lines WL or a combination of the two.

The sources 14a of the memory cells MC in each block are coupled to a common source line SL1, . . . , SLk so that they are electrically connected to each other. The common source lines SL are connected to respective erase circuits 56(1), . . . , 56(k), which are provided for the respective blocks. The block to be erased is selected by an input erase signal E, and then a predetermined erase voltage is applied to the sources 14a of all of the memory cells MC in the block from the corresponding erase circuit 56, thereby erasing data from all of the memory cells in the block at once. The erase operation may be performed on one block or alternatively to some or all of the blocks.

Upper address signals Ay+1 to Az (for example, z=16) are input to the word decoder 52. An intended word line WL is selected by decoding the upper address signals with the word decoder 52. Whereas, data (for example, D0 to D7 in the case of 8-bit data) and lower address signals A0 to Ay (for example, y=5) are input to the column decoder 54. An intended bit line BL is selected by decoding the lower address signals with the column decoder 54. In a write operation, the column decoder 54 outputs data to the selected bit line BL, and in a read operation, the column decoder 54 outputs a voltage of 1 V to the selected bit line BL. The potential of the bit line BL is detected by a sense circuit (not shown) which is provided in the column decoder 54 so as to read out data. In an erase operation, the output of the column decoder 54 is controlled to have a high impedance, whereby the bit line BL connected to the output of the column decoder 54 is open (opening the bit line BL).

Figure 6:
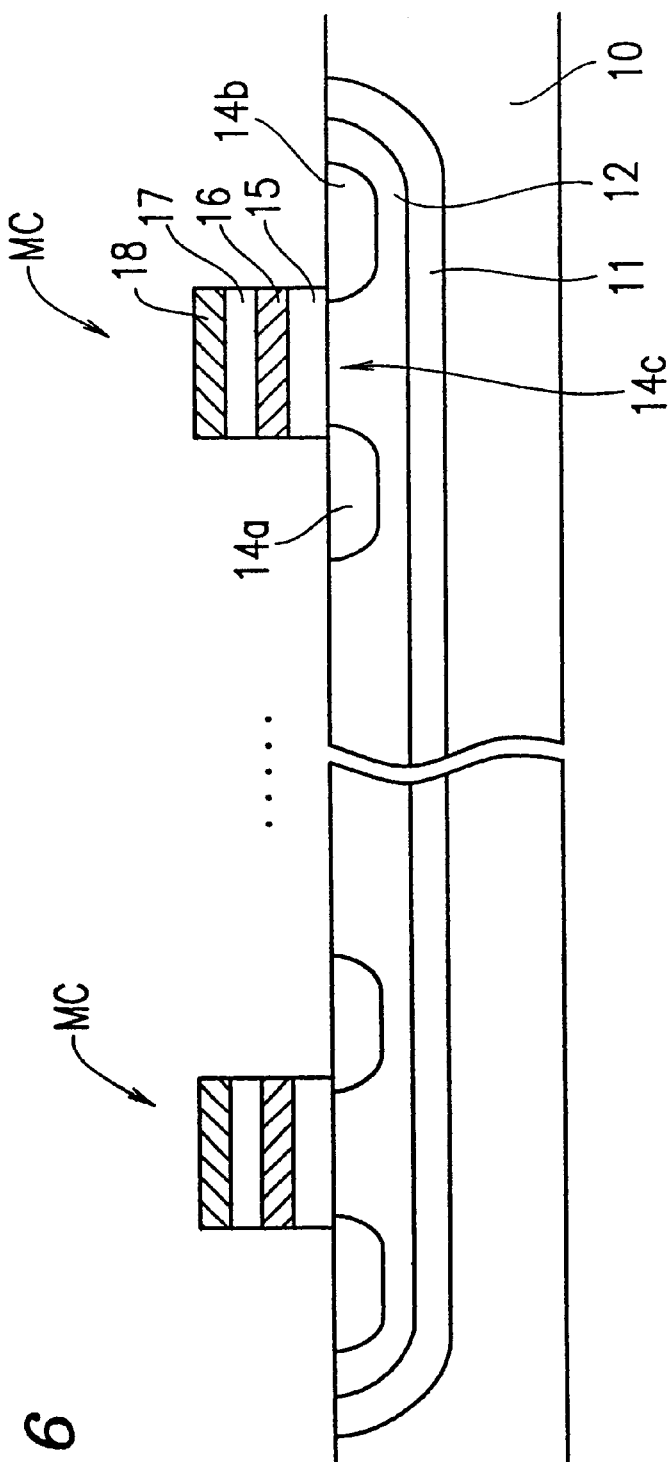
FIG. 6 is a cross-sectional view illustrating the structure of memory cells in a non-volatile semiconductor memory device used in the present invention.

The structure of each memory cell MC used in the present invention will now be described with reference to FIG. 6. FIG. 6 is a cross-sectional view along line VI—VI in FIG. 5.

Each memory cell MC is formed by a field effect transistor. More specifically, as shown in FIG. 6, the memory cells MC includes a substrate 10, and the source 14a and drain 14b provided on the substrate 10 with a channel region 14c extending between the source 14a and the drain 14b. The memory cell MC further includes a tunnel oxide film 15 on the channel region 14c, and the floating gate 16 over the channel region 14c via the tunnel oxide film 15. Moreover, the control gate 18 is provided over the floating gate 16 via an interlayer insulating film 17. A number of such memory cells MC together form a block, and the sources 14a in each block are electrically connected to one other.

The memory cells MC in each block are provided in a p-well 12 (second well) which is provided on the substrate 10. The p-well 12 is electrically isolated from the substrate 10 by an n-well 11 (first well). The structure as shown in FIG. 6 will be hereinafter referred to as a "triple-well structure". The triple-well structure is provided for each block, and a triple-well structure of one block is electrically isolated from a triple-well structure of the adjacent block. In the illustrated example, each of the blocks by which a batch erase operation is performed is surrounded by the first well 11. The formation of the first well 11 does not substantially increase the layout area of the device, and such an insubstantial increase in the layout area does not raise problems with respect to the area of the entire non-volatile semiconductor memory device.

The present invention is based on such a structure where the p-well 12 (second well) in which the memory cells MC are provided is electrically isolated from the substrate 10 (p-substrate) by the n-well 11 (first well). In a pre-erase write operation, a first voltage (for example, a positive voltage) is applied to the control gates of the memory cells in the block to be erased, and a second voltage of an opposite polarity to the first voltage (for example, a negative voltage) is applied to the second well. According to the present invention, it is possible to reduce the potential of the second well while maintaining the potential of the p-substrate 10 at the reference voltage. Therefore, it is possible to significantly reduce the voltage to be applied to the control gate in a pre-erase write operation as compared to conventional methods.

The method for erasing data from a non-volatile semiconductor memory device according to the present invention will now be described in greater detail.

(Embodiment 1)

The principle of operation of the memory cells MC as shown in FIG. 6 in a write mode, an erase mode, and a read mode will be described with reference to Table 3. Table 3 shows voltages to be applied to the respective components of the memory cells MC in a write mode, an erase mode, a pre-erase write mode, and a read mode.

TABLE 3

|  | Control gate | Drain | Source | p-well | n-well | P-Substrate |
|---|---|---|---|---|---|---|
| Write | 10 V | 6 V/0 V | 0 V | 0 V | 3 V | 0 V |
| Erase | −9 V | Open | 6 V | 0 V | 3 V | 0 V |
| Pre-erase write | 12 V | Open | −9 V/0 V | −9 V/0 V | 3 V | 0 V |
| Read | 5 V | 1 V | 0 V | 0 V | 3 V | 0 V |

In the write (programming) mode, a voltage of 10 V, for example, is applied to the control gate 18 of the memory cell to which data is to be written, a voltage of 3 V, for example, is applied to the n-well 11, a voltage of 6 V, for example, is applied to the drain 14b, and a reference voltage of 0 V, for example, is applied to the source 14a, the p-well 12 and the p-substrate 10. The drain of each memory cell to which no data is to be written (non-selected memory cell) is set to the reference voltage (e.g., 0 V).

Figure 1:
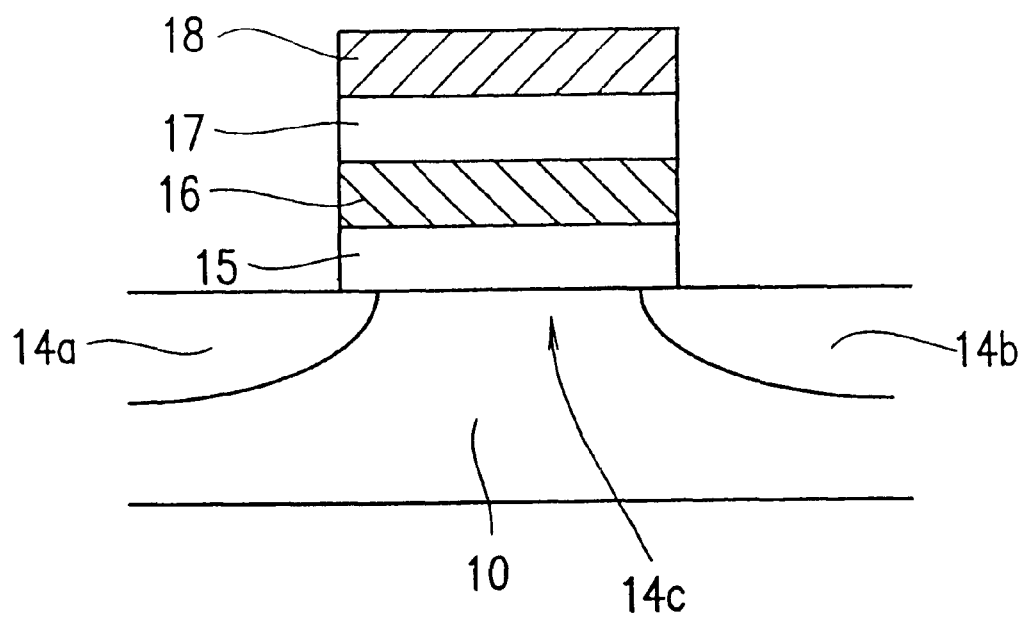
FIG. 1 is a cross-sectional view illustrating the structure of a memory cell in a conventional non-volatile semiconductor memory device.
Figure 2:
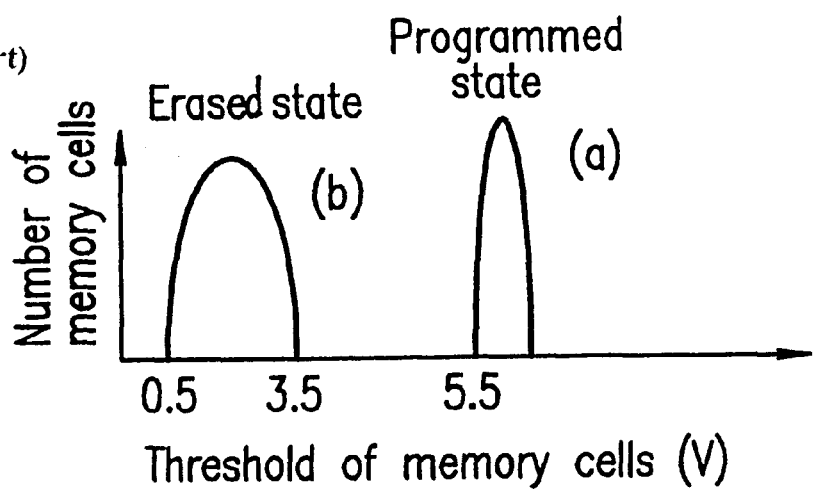
FIG. 2 is a graph illustrating the threshold voltages of a non-volatile semiconductor memory device.

As a result of such a voltage application, a large current of 500 μA/cell flows through the channel region 14c, thereby generating CHEs in a portion of the drain 14b side of the memory cell where there is a high electric field. When CHEs jump over the energy barrier of the tunnel oxide film 15 so as to be injected into the floating gate 16, the threshold voltage of the memory cell increases. The memory cell to which data has been written as described above has a threshold voltage equal to or greater than 5.5 V as shown in FIG. 2 by the curve labelled "Programmed state (a)".

Figure 12:
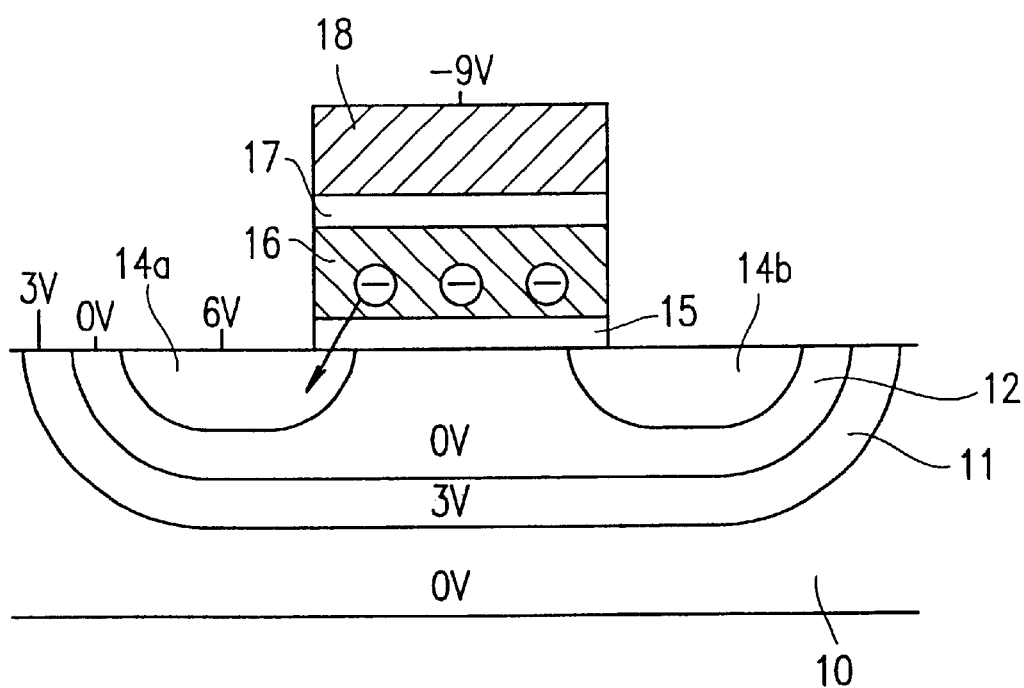
FIG. 12 illustrates an erase write operation in a method for erasing data from a non-volatile semiconductor memory device.

In the erase operation, a voltage of −9 V, for example, is applied to the control gate 18, and a voltage of 6 V, for example, is applied to the source 14a, while opening the drain 14b. Whereas, a voltage of 3 V, for example, is applied to the n-well 11, and the p-well 12 and the p-substrate 10 are controlled to be at the reference voltage of 0 V, for example. Thus, electrons are withdrawn from the floating gate 16 on the source 14a side of the memory cell through an FN tunnel phenomenon, thereby reducing the threshold voltage to be less than or equal to 3.5 V. As a result, the memory cell enters the erased state (see the curve in FIG. 2 labelled "Erased state (b)"). How the electrons are withdrawn from the floating gate 16 is shown in FIG. 12.

For a memory cell to/from which data has been written/erased as described above, a read operation can be performed by applying a voltage of 5 V to the control gate 18 and a voltage of 1 V to the drain 14b, while controlling the potential of the source 14a to be 0 V. Moreover, a voltage of 3 V, for example, is applied to then-well 11, and a reference voltage of 0 V, for example, is applied to the p-well 12 and the p-substrate 10. Under such voltage conditions, if data stored in the memory cell is in the erased state, the threshold voltage of the memory cell is less than or equal to 3.5 V. Therefore, a current flows through the memory cell, which is detected by a sense circuit (not shown) connected to the drain, whereby the data in the memory cell is determined to be "1" (i.e., in the erased state). If data stored in the memory cell is in the written state, the threshold voltage of the memory cell is equal to or greater than 5.5 V, and no current flows through the memory cell, whereby the data in the memory cell is determined by the sense circuit to be "0" (i.e., in the written state).

Figure 7:
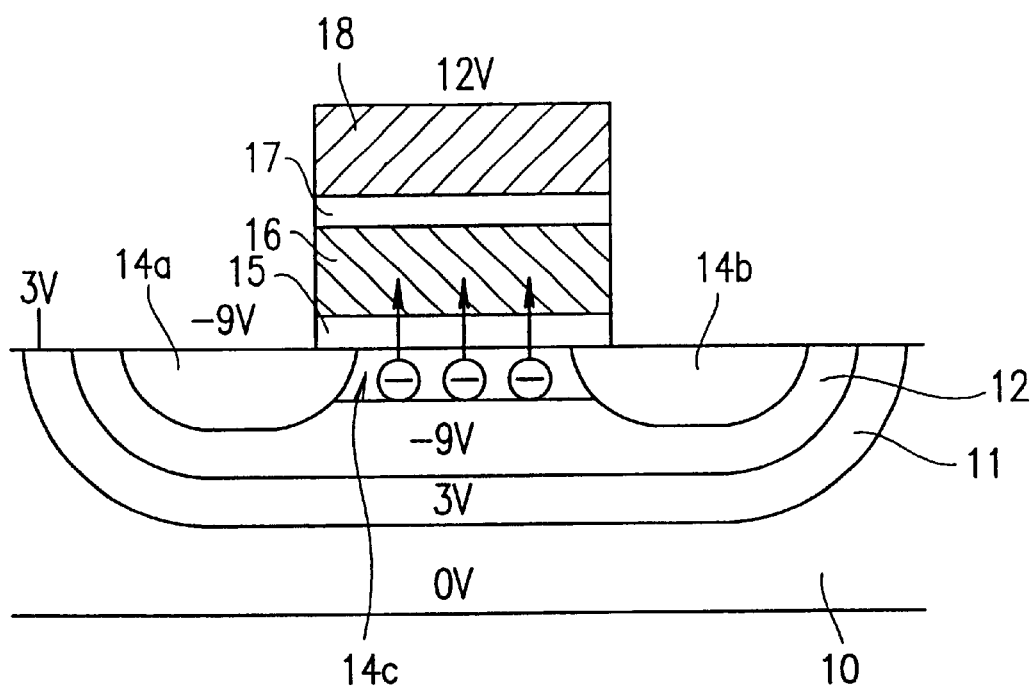
FIG. 7 illustrates a pre-erase write operation in a method for erasing data from a non-volatile semiconductor memory device of the present invention.

Next, the pre-erase write operation which is performed before performing the above-described erase operation will be described with reference to FIG. 7. FIG. 7 illustrates a one-cell portion of the structure shown in FIG. 6.

When the pre-erase write operation is initiated, a voltage of 12 V, for example, is applied to the control gate 18, and a voltage of −9 V, for example, is applied to the source 14a and the p-well 12, while opening the drain 14b. Whereas, the potential of the n-well 11 is controlled to be 3 V, for example, so as to electrically isolate the p-well 12 from the p-substrate 10 and the potential of the p-substrate 10 is controlled to be at the reference voltage, for example, 0 V. Under such voltage conditions, electrons are injected into the floating gate 16 from the channel region 14c by the FN tunnel phenomenon, as shown in FIG. 7, rather than from the source 14a side of the memory cell. As a result, the threshold voltage of the memory cell increases and the memory cell enters the written state. In order to realize a pre-erase write operation utilizing the FN tunnel phenomenon, the potential difference between the control gate 18 and the second well 12 is preferably set to 16–21 V where a tunnel oxide film 15 having a thickness of 80–110 Å is used. For example, when the thickness of the tunnel oxide film 15 is 110 Å, the voltage for the control gate 18 may be set to 12 V while setting the voltage for the p-well 12 to be −9 V.

As described above, the present invention employs a triple-well structure as the memory cell while electrically isolating the p-well 12 from the p-substrate 10 so as to reduce the potential of the p-well 12 while maintaining the potential of the p-substrate 10 at the reference voltage. As a result, it is possible to reduce the voltage applied to the control gate 18 in the pre-erase write operation from 18 V (as in Conventional Example 2) to 12 V, for example. Therefore, it is possible to reduce the voltage resistance level of a transistor used, thereby improving the reliability of the device. Moreover, since a high voltage application is not used, it is possible to reduce the load on peripheral circuits such as a charge pump circuit and to reduce the current consumption.

The reduction in the voltage to be applied to the control gate 18 also leads to a reduction in the layout area for a high voltage generation charge pump which is provided for generating the voltage. A high voltage such as that applied to the control gate 18 is normally obtained by increasing the supply voltage from a charge pump circuit provided in the non-volatile semiconductor memory device. A charge pump circuit generally has a poor efficiency and tends to result in a large layout area. By reducing the voltage to be applied to the control gate 18, it is possible to reduce the layout area which is required for the high voltage generation charge pump and thus to reduce the total area of the non-volatile semiconductor memory device.

By isolating the p-well 12 (second well) from the substrate 10 by the n-well 11 (first well), the potential of the substrate 10 can be controlled to be at the reference potential. Therefore, it is possible to stably obtain various voltages from the charge pump circuit.

Moreover, since the pre-erase write operation is performed only on the block to be erased among the plurality of blocks of memory cells (e.g., 64 kB), it is not necessary to erase and re-write all of the blocks of memory cells, thereby increasing the efficiency of the operation.

Figure 8:
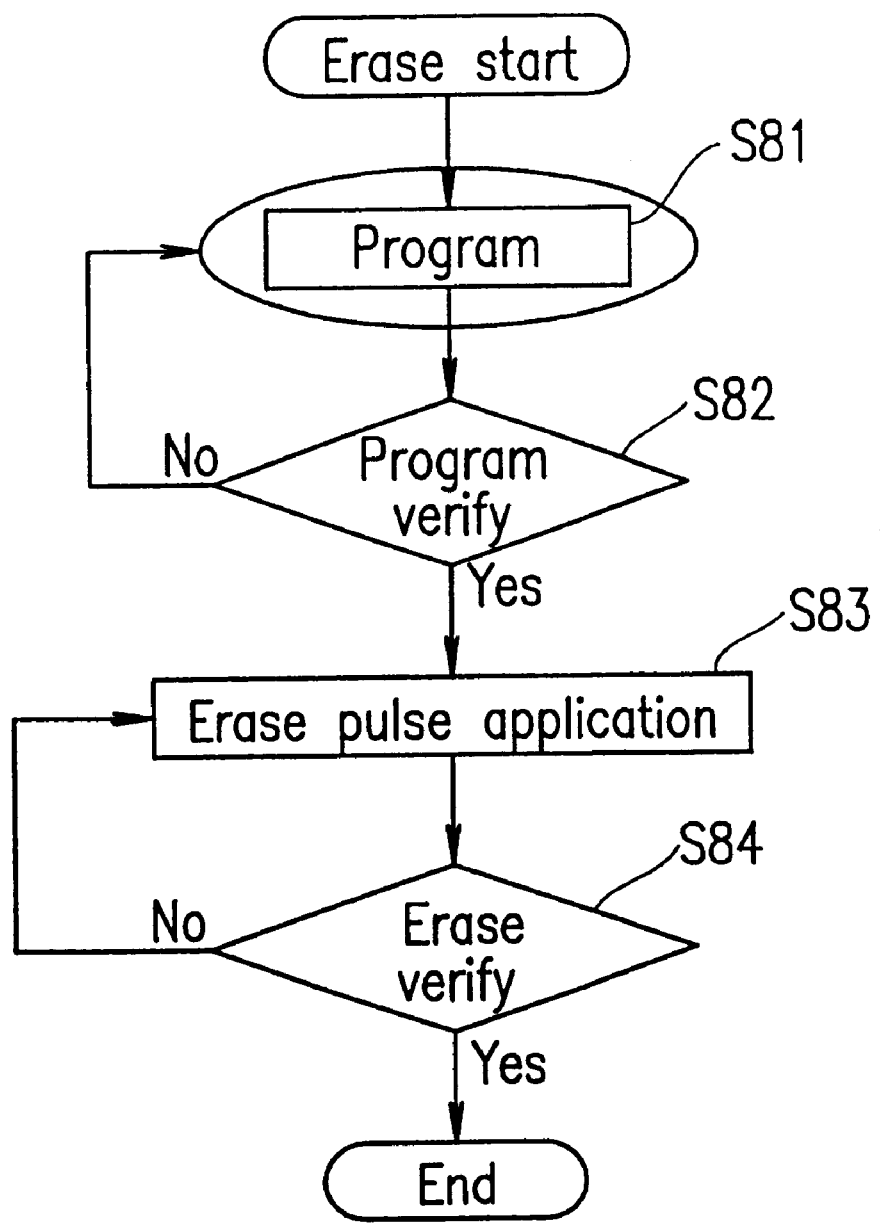
FIG. 8 is a flow chart illustrating an erase algorithm of a method for erasing data from a non-volatile semiconductor memory device according to Embodiment 1 of the present invention.

The erase method of the present invention including the above-described pre-erase write operation will be described with reference to FIG. 8. FIG. 8 illustrates an algorithm of the erase operation.

When the erase operation is initiated, in step S81, all of the memory cells in the block to be erased are brought into the written state simultaneously through the above-described write operation utilizing the FN tunnel phenomenon. In this step, a voltage of 12 V, for example, is applied to all of the word lines WL which are connected to the control gates 18 of the memory cells in the block to be erased, a voltage of −9 V, for example, is applied to the sources 14a and the p-well 12 in which the memory cells are provided, and a voltage of 3 V, for example, is applied to the n-well 11, while opening the drain 14b. The voltage of −9 V is applied only to the sources 14a of the memory cells and the p-well 12 in the block to be erased, while the reference voltage (e.g., 0 V) is applied to the sources and p-wells of the other blocks which are not to be erased. Under the voltage application conditions shown in Table 3, the amount of time for which a voltage is applied in the pre-erase write operation is about 2 ms.

By such a voltage application, in the memory cells in the block to be erased, electrons are injected into the floating gate 16 from the channel region 14c by the FN tunnel phenomenon rather than from the drain 14b side of the memory cell. Thus, the threshold voltage of the memory cells is increased, whereby the memory cells enter the written state.

Next, a program verify operation is performed by 8-bit blocks (step S82) for verifying that the threshold voltage of the memory cell to which data has been written in step S81 is equal to or greater than 5.5 V. If the threshold voltage is equal to or greater than 5.5 V for all of the memory cells, the pre-erase write operation is completed and the process proceeds to step S83. When any cell whose threshold voltage is less than 5.5 V is found, the write operation is continued by again applying a write pulse. The time for the pulse application typically may be about 2 ms, but may alternatively be set to any other value. Typically, the time for the pulse application is set such that the pre-erase write operation can be completed by a single pulse application.

When the pre-erase write operation is completed, an erase pulse is applied to all of the memory cells in the block simultaneously in step S83. The pulse width may be about 10 ms and the number of pulses applied may be about 30. By this erase pulse application, electrons are withdrawn from the source side of the memory cell through the FN tunnel phenomenon, whereby the threshold voltage of each memory cell in the block to be erased is less than or equal to 3.5 V. In this example, the pulse width is set to be small so that the erase verify operation can be performed often to prevent over-erasing.

Next, in step S84, an erase verify operation is performed for verifying that the threshold voltage is less than or equal to 3.5 V for all of the memory cells in the block to be erased. If the threshold voltage is not less than or equal to 3.5 V for any of the memory cells, the process returns to step S83 to continue the erase operation. If the threshold voltage is less than or equal to 3.5 V for all of the memory cells, the erase operation is completed (End).

In addition to the above-described effect of reducing the voltage to be applied to the control gate 18 (from 18 V as is conventional to 12 V), the present invention also provides a significant effect of reducing the amount of time for which a write voltage is applied in the pre-erase write operation. In the present embodiment, the amount of time for which a write voltage is applied in the pre-erase write operation is about 2 ms, while it is 131 ms in Conventional Example 1 where CHEs are used (each block to be erased is a 64-kB block, and the pre-erase write operation is performed in the unit of bytes). Thus, in the present invention, as compared to Conventional Example 1, the amount of time for which a write voltage is applied in the pre-erase write operation is significantly reduced, by about 98%.

Figure 9:
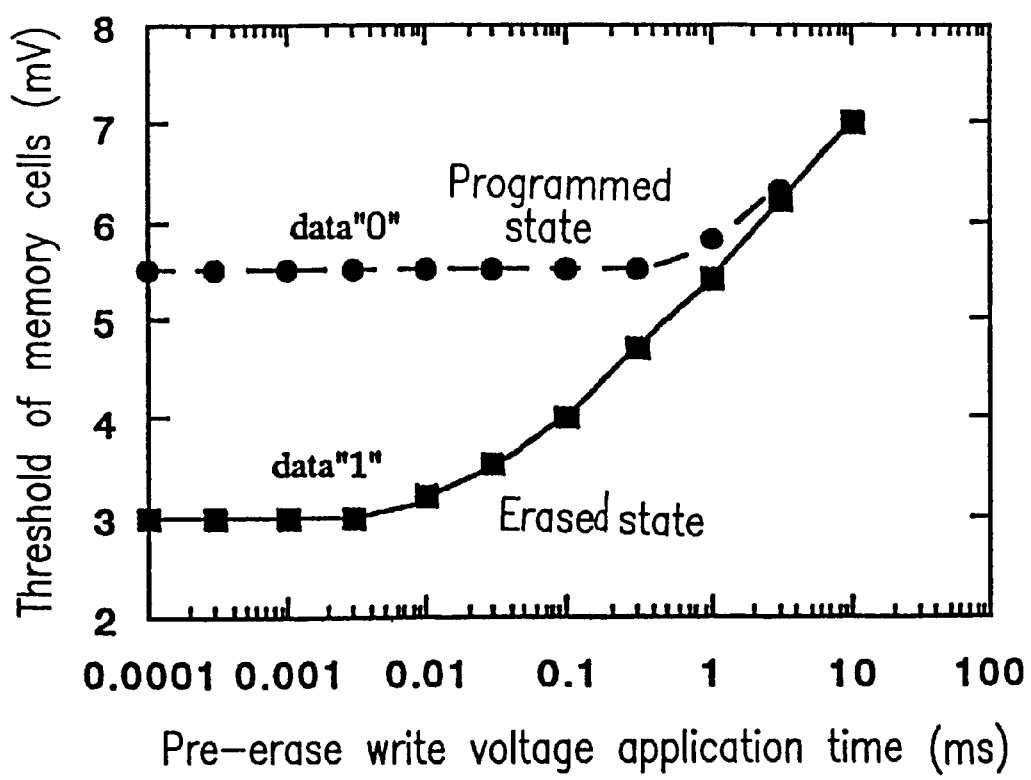
FIG. 9 is a graph illustrating changes in the threshold voltage of a memory cell with respect to the pre-erase write voltage application time.

Even with the short period of time of 2 ms, the distribution of threshold voltages of the memory cells in the block to be erased can be controlled within a desired range, as shown in FIG. 9 which illustrates changes in the threshold voltage of a memory cell with respect to the pre-erase write voltage application time. Needless to say, prior to the pre-erase write operation, the block to be erased includes memory cells in the written state (whose threshold voltage is equal to or greater than 5.5 V) and memory cells in the erased state (whose threshold voltage is less than or equal to 3.5 V) which are distributed across the block in a random manner. As can be seen from FIG. 9, the memory cells which are originally in the erased state (denoted by solid squares) are brought into the written state with the threshold voltage being increased to be equal to or greater than 5.5 V after a pre-erase write operation of about 2 ms. On the other hand, the memory cells which are originally in the written state (denoted by solid circles) are not substantially changed from their initial state with the threshold voltage being increased to only about 6 V after a pre-erase write operation of about 2 ms. The results shown in FIG. 9 indicate that even when written memory cells and erased memory cells coexist in a random manner, the distribution of threshold voltages of the memory cells in the block to be erased can be controlled within a range of 5.5 V to 6.5 V by performing the pre-erase write operation under the above-described voltage application conditions for about 2 ms.

In the present embodiment, since the FN tunnel phenomenon is utilized, the amount of current per one cell to be consumed in the pre-erase write operation is about 10 pA, which represents a 1×10⁵-fold or greater reduction from the value of 500 μA in the Conventional Example 1 where CHEs are used. Thus, a substantial reduction in power consumption can be achieved.

In summary, according to the present invention, it is possible to reduce the maximum voltage required for the pre-erase write operation and thus to reduce the voltage resistance level required for the transistors to be used. As a result, the reliability of a peripheral transistor section is improved. Moreover, the substantial reduction in the pre-erase write time enables one to reduce the erase time and the current consumption.

(Embodiment 2)

A method for erasing data from a non-volatile semiconductor memory device according to Embodiment 2 of the present invention will now be described.

In Embodiment 1, the erase operation is performed by withdrawing electrons from the floating gate 16 from the source 14a side of the memory cell through the FN tunnel phenomenon (see FIG. 12). In contrast, in the present embodiment, the erase operation is performed by withdrawing electrons from the floating gate 16 from the channel region 14a of the memory cell through the FN tunnel phenomenon. This can be achieved by controlling the potential of the source 14a to be at the same level as the potential of the p-well 12. The present embodiment provides an effect of further reducing the erase time.

The structure of the memory array section and the structure of the memory cells used in the present embodiment are similar to those shown in FIGS. 5 and 6, respectively. Table 4 shows voltages to be respectively applied to the control gate 18, the drain 14b, the source 14a, the p-well 12, the n-well 11 and the substrate 10 of the memory cell in a write mode, an erase mode, a pre-erase write mode, and a read mode.

TABLE 4

| | Control gate | Drain | Source | p-well | n-well | p-Substrate |
|---|---|---|---|---|---|---|
| Write | 10 V | 6 V/0 V | 0 V | 0 V | 3 V | 0 V |
| Erase | −9 V | Open | 10 V | 10 V | 10 V | 0 V |
| Pre-erase write | 12 V | Open | −9 V/0 V | −9 V/0 V | 3 V | 0 V |
| Read | 5 V | 1 V | 0 V | 0 V | 3 V | 0 V |

The only difference between the present embodiment and Embodiment 1 lies in the operation of the erase mode. The operation of other modes (the write mode, the pre-erase write mode and the read mode) is similar to that of Embodiment 1. The erase operation of the present embodiment will now be described.

Figure 10:
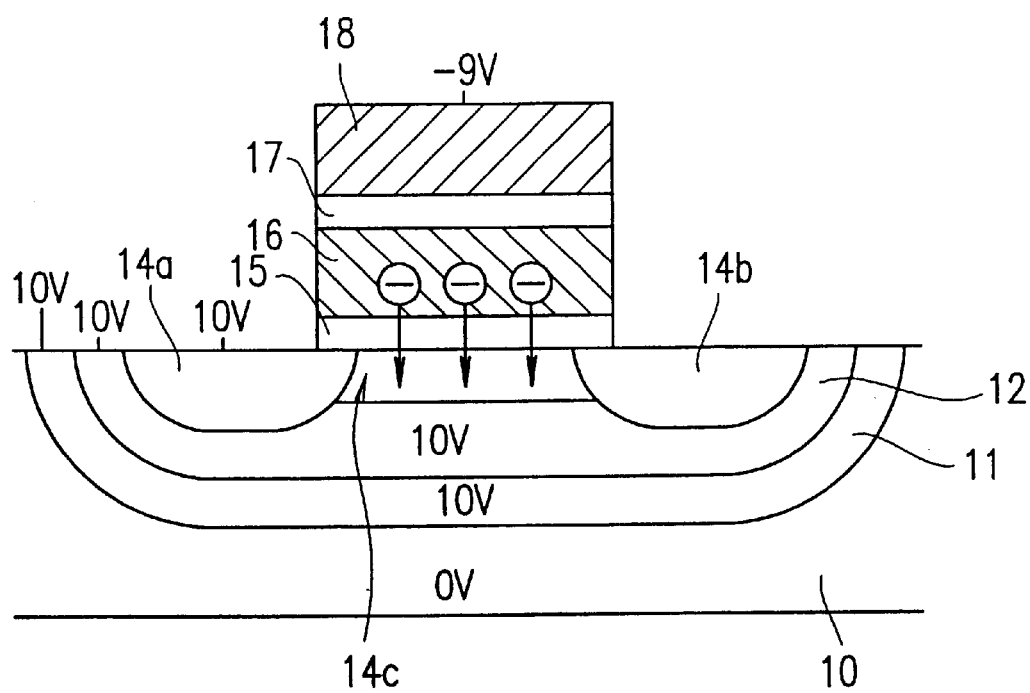
FIG. 10 illustrates an erase write operation in a method for erasing data from a non-volatile semiconductor memory device according to Embodiment 2 of the present invention.

In the erase operation, a high positive voltage of 10 V, for example, is applied to the source 14a, the p-well 12 and the n-well 11. A voltage of −9 V, for example, is applied to the control gate 18, while opening the drain 14b. The potential of the p-substrate 10 is controlled to be at the reference voltage of 0 V, for example. Thus, electrons are withdrawn from the floating gate 16 from the channel region 14a through the FN tunnel phenomenon, thereby reducing the threshold voltage of the memory cell to be less than or equal to 3.5 V. Thus, the memory cells enter the erased state. How the electrons are withdrawn from the floating gate 16 is shown in FIG. 10.

Figure 11:
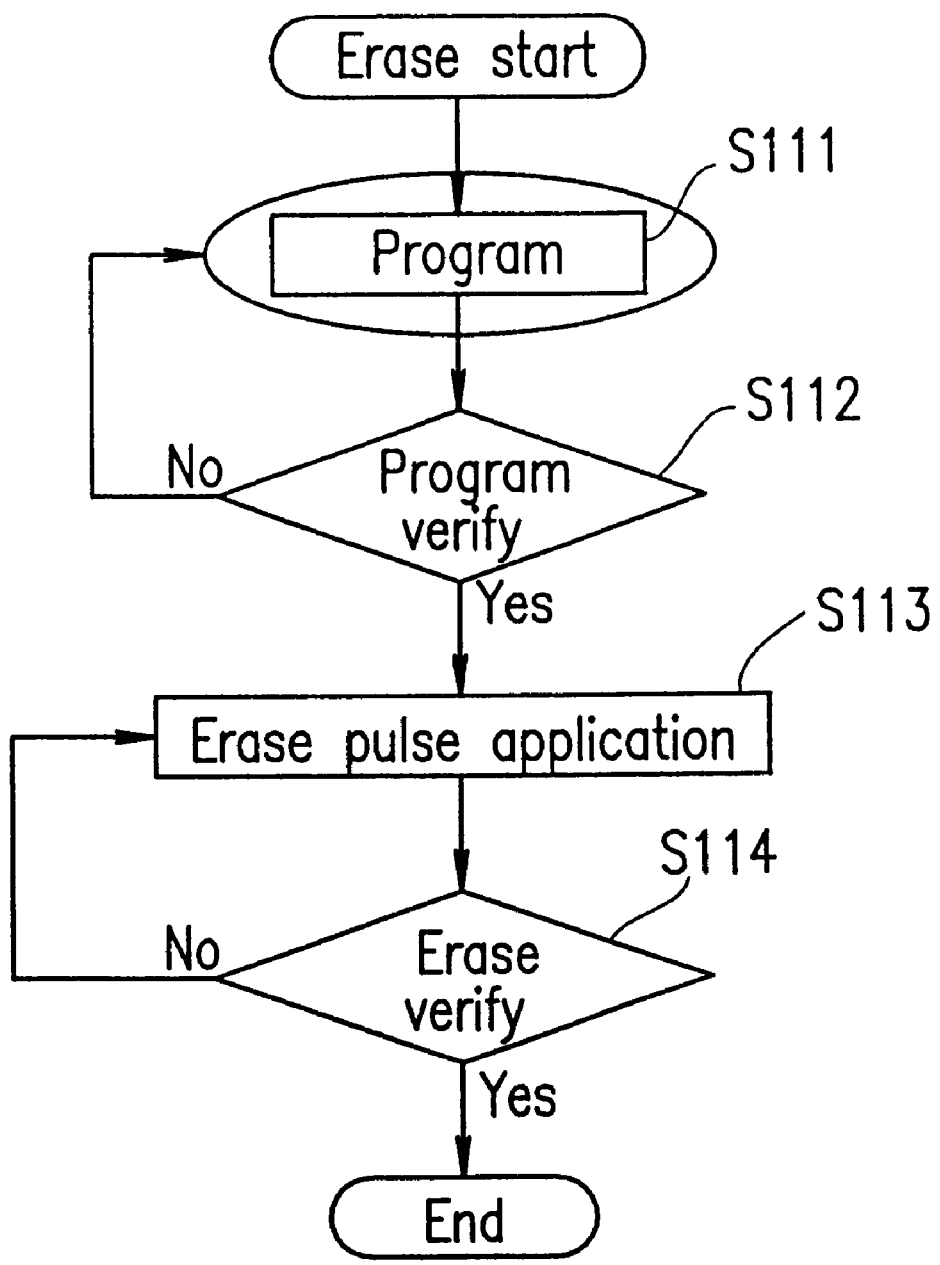
FIG. 11 is a flow chart illustrating an erase algorithm according to Embodiment 2 of the present invention.

The erase method of the present embodiment will now be described with reference to FIG. 11. FIG. 11 illustrates an algorithm of the erase operation.

When the erase operation is initiated, in step S111, all of the memory cells in the block to be erased are brought into the written state simultaneously by the write operation utilizing the FN tunnel phenomenon. In this step, a voltage of 12 V, for example, is applied to all of the word lines WL which are connected to the control gates 18 of the memory cells in the block to be erased, a voltage of −9 V, for example, is applied to the sources 14a and the p-well 12 in which the memory cells are provided, and a voltage of 3 V, for example, is applied to the n-well 11, while opening the drain 14b. The voltage of −9 V is only applied to the sources 14a of the memory cells and the p-well 12 in the block to be erased, while the reference voltage (e.g., 0 V) is applied to the sources and p-wells of the other blocks which are not to be erased. Under such voltage conditions, in the memory cells in the block to be erased, electrons are injected into the floating gate 16 from the channel region 14a through the FN tunnel phenomenon. Thus, the threshold voltage of the memory cells is increased, whereby the memory cells enter the written state.

Next, a program verify operation is performed by 8-bit blocks (step S112) for verifying that the threshold voltage of the memory cell to which data has been written in step S111 is equal to or greater than 5.5 V. If the threshold voltage is equal to or greater than 5.5 V for all of the memory cells, the pre-erase write operation is completed and the process proceeds to step S113. When any cell whose threshold voltage is less than 5.5 V is found, the write operation is continued by again applying a write pulse.

When the pre-erase write operation is completed, an erase pulse is applied to all of the memory cells in the block simultaneously in step S113. The pulse width may be about 100 μs and the number of pulses applied may be about 30. Thus, the total erase pulse width is about 3 ms. By this erase pulse application, electrons are withdrawn from the floating gate 16 from the channel region 14c by the FN tunnel phenomenon, whereby the threshold voltage of each memory cell in the block to be erased is less than or equal to 3.5 V.

Next, in step S114, an erase verify operation is performed for verifying that the threshold voltage is less than or equal to 3.5 V for all of the memory cells in the block to be erased. If the threshold voltage is not less than or equal to 3.5 V for any of the memory cells, the process returns to step S113 to continue the erase operation. If the threshold voltage is less than or equal to 3.5 V for all of the memory cells, the erase operation is completed (End).

Figure 3:
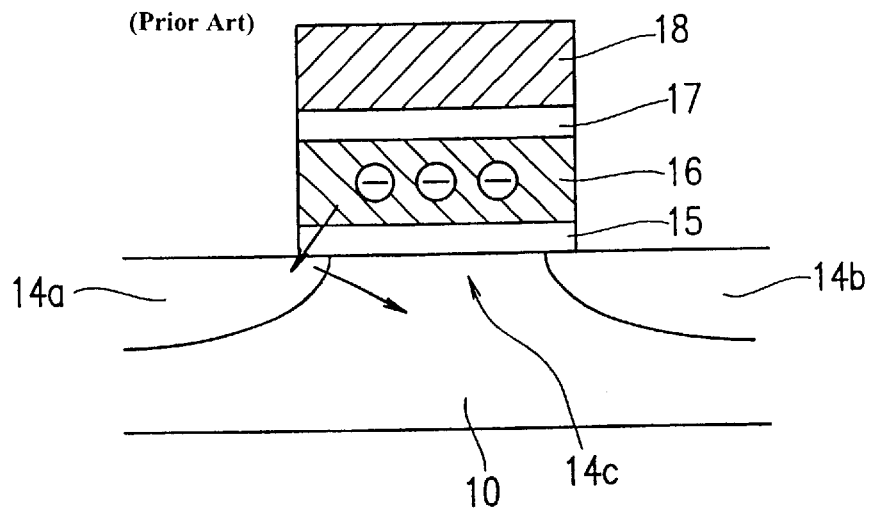
FIG. 3 illustrates an erase operation for a non-volatile semiconductor memory device.
Figure 4:
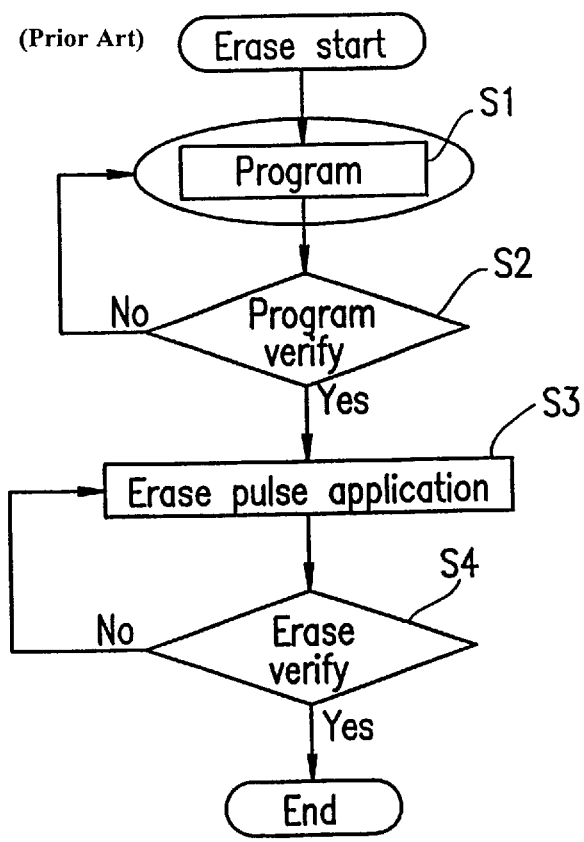
FIG. 4 is a flow chart illustrating an erase algorithm of a conventional method for erasing data from a non-volatile semiconductor memory device.

In the present embodiment, electrons are withdrawn from the floating gate 16 using the channel region 14c. Therefore, no BTBT current occurs (see FIG. 3) as in the case where electrons are withdrawn from the source side of the memory cell (Embodiment 1). Therefore, according to the present embodiment, a relatively large erase current can be applied, thereby realizing a faster erase operation. According to the present embodiment, it is possible to reduce the long erase pulse application time of 300 ms (10 ms×30 times) as in Embodiment 1 so as to realize a total erase time less than or equal to 10 ms. Moreover, since no BTBT current is generated, the amount of consumed current per one cell is about 10 pA, which represents a significant reduction in the current consumption with respect to the amount of consumed current per one cell of 10 nA in conventional methods where a BTBT current flows through the device.

In the pre-erase write operation of the present embodiment, a write operation which utilizes the FN tunnel phenomenon using the channel region is performed on memory cells in the erased state whose threshold voltage is low. A similar erase operation using the channel region is performed also in subsequent erase operations. Thus, electrons are exchanged, i.e., injected and withdrawn, through the floating gate. It is believed in the art that such an exchange of electrons contributes to the improvement in the reliability of the memory cells (see IEICE Trans. Electron. Vol. E79-C1996, pp. 832 "A Novel Programming Method Using a Reverse Polarity Pulse in Flash EEPROMs"). Therefore, according to Embodiment 2, it is likely that the reliability of the memory cells can be further improved as compared to conventional methods or the method of Embodiment 1.

As described above, according to the present embodiment, it is possible to reduce the erase time and the current consumption, thereby improving the reliability of the memory cells. As in Embodiment 1, it is possible to reduce the maximum voltage required for the pre-erase write operation and thus to reduce the voltage resistance level required for the transistors to be used. As a result, the reliability of a peripheral transistor section is improved.

According to the present invention, each memory cell is provided on the second well 12 of a triple-well structure, while electrically isolating the second well 12 from the substrate 10 by the first well 11, thereby reducing the voltage to be applied to the control gate. For example, a negative voltage is applied to the second well in an attempt to substantially reduce the positive voltage to be applied to the control gate 18 of the memory cell. By such a structure, it is not necessary to use highly voltage resistant transistors in the word line output stage. Thus, it is possible to reduce the layout area occupied by the output stage transistors. This reduction in the layout area facilitates the design of an entire non-volatile semiconductor memory device having a memory cell array in which a plurality of memory cells are regularly arranged in an array. By the reduction in the voltage to be applied for operating the device, it is possible to reduce the layout area occupied by the internal charge pump circuit which is provided for boosting an externally provided voltage to obtain a high voltage. The reduction in the area to be occupied by the charge pump circuit whose efficiency is poor significantly contributes to the reduction in the chip size of the entire non-volatile semiconductor memory device. The reduction in the voltage to be applied for operating the device also leads to the improvement in the reliability of the non-volatile semiconductor memory device.

Moreover, since a write operation based on the FN tunnel phenomenon in which the amount of consumed current per one cell is small is employed as the pre-erase write operation, an increase in the speed of the pre-erase write operation and a reduction in the power consumption can be obtained. The reduction in the amount of consumed current per one cell in turn reduces the load on a charge pump circuit which is provided for obtaining a voltage to be applied in the write operation, thereby increasing the freedom in the value of acceptable current on the lines in the IC chip. This facilitates the design of an entire non-volatile semiconductor memory device.

Since the pre-erase write operation utilizes the FN tunnel phenomenon in the channel region, no current is consumed for generating CHEs, whereby it is possible to reduce the power consumption and to increase the speed of the erase operation using a batch write operation.

By electrically isolating the second well 12 from the substrate 10 by the first well 11, it is possible to maintain the potential of the substrate 10 to be at the reference potential. Therefore, it is possible to stably obtain various voltages from the charge pump circuit. When the substrate 10 is a p-substrate, the first well is an n-well and the second well is a p-well, it is possible to use a p-substrate (wafer) which is widely available in the market. Therefore, the device for use with the present invention can be produced without modifying conventional processes and thus without increasing the cost of production.

Where the erase operation is performed so that the FN tunnel phenomenon occurs only in a limited area on the source side of the memory cell, the source voltage can be set to a relatively low value. Alternatively, where the erase operation is performed by withdrawing electrons from the floating gate by the FN tunnel phenomenon in the channel region, a BTBT current is not generated, whereby it is possible to reduce the power consumption and to increase the speed of operation by employing a high voltage application. Moreover, an improvement in the reliability of the memory cells can be obtained by exchanging electrons between the floating gate and the channel region as in the above-described pre-erase write operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for erasing data from a non-volatile semiconductor memory device including a plurality of memory cells arranged in a matrix in which data can be electrically written to or erased from each of the memory cells, each of the memory cells being formed by a field effect transistor including a drain, a source, a floating gate and a control gate, the plurality of memory cells being grouped into one or more blocks, each of the blocks including a first well of a first conductivity type which is provided on a substrate of a second conductivity type, a second well of the second conductivity type which is provided on the first well so as to be electrically isolated from the substrate by the first well, and a plurality of memory cells having a plurality of sources which are provided on the second well, the sources of the memory cells in each block being commonly connected to one another, the method comprising the steps of:

withdrawing electrons from each floating gate of each of the memory cells through a Fowler-Nordheim tunnel phenomenon so as to perform a batch erase operation of erasing data from all of the memory cells in each block; and prior to the batch erase operation, performing a pre-erase write operation in which a first voltage, a second voltage of an opposite polarity to the first voltage and a third voltage of the same polarity as the first voltage are respectively applied to the control gates, the second wells and the first wells of all of the memory cells in the block to be erased so that electrons are injected into the floating gates of each of the memory cells through a Fowler-Nordheim tunnel phenomenon.

2. A method for erasing data from a non-volatile semiconductor memory device according to claim 1, wherein the first voltage and the third voltage are positive voltages, the second voltage is a negative voltage, and the first voltage is higher than the third voltage.

3. A method for erasing data from a non-volatile semiconductor memory device according to claim 1, wherein in the batch erase operation, a negative voltage is applied to each control gate of each of the memory cells and a positive voltage is applied to the source so as to withdraw electrons from a source side of the memory cells, thereby reducing a threshold voltage of the memory cells.

4. A method for erasing data from a non-volatile semiconductor memory device according to claim 1, wherein in the batch erase operation, a negative voltage is applied to each control gate of each of the memory cells, and a positive voltage is applied to each source of each of the memory cells and the second well so as to withdraw electrons from a channel region between respective sources and drains, thereby reducing a threshold voltage of the memory cells.

5. A method for erasing data from a non-volatile semiconductor memory device according to claim 1, wherein in the pre-erase write operation, a positive voltage is applied to each control gate of each of the memory cells, and a negative voltage is applied to each source of each of the memory cells and the second well so that electrons are injected from a channel region between respective sources and drains into the floating gate, thereby increasing a threshold voltage of the memory cells.

* * * * *

UNITED STATES PATENT AND TRADEMARK OFFICE
CERTIFICATE OF CORRECTION

PATENT NO. : 6,404,681 B1
DATED : June 11, 2002
INVENTOR(S) : Yasuaki Hirano

It is certified that error appears in the above-identified patent and that said Letters Patent is hereby corrected as shown below:

Column 1,
Line 12, should end with the word "electrons". The remainder of that line, -- 2.
Description of the Related Art --, is the heading for the next section.
Line 25, please replace "14a" with -- 14c --.

Column 11,
Line 63, please replace "14a" with -- 14c --.

Column 12,
Line 30, please replace "14a" with -- 14c --.
Line 55, please replace "14a" with -- 14c --.

Signed and Sealed this

Twenty-ninth Day of October, 2002

Attest:

*Attesting Officer*

JAMES E. ROGAN
*Director of the United States Patent and Trademark Office*